(12) United States Patent
Kim et al.

(10) Patent No.: US 11,597,995 B2
(45) Date of Patent: Mar. 7, 2023

(54) METHOD OF MANUFACTURING MASK AND METHOD OF MANUFACTURING DISPLAY DEVICE

(71) Applicant: Samsung Display Co., Ltd., Yongin-si (KR)

(72) Inventors: Jeunghoon Kim, Yongin-si (KR); Seungmin Jin, Yongin-si (KR); Jaemin Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/953,123

(22) Filed: Nov. 19, 2020

(65) Prior Publication Data
US 2021/0285086 A1    Sep. 16, 2021

(30) Foreign Application Priority Data

Mar. 13, 2020 (KR) .......................... 10-2020-0031315

(51) Int. Cl.
*C23C 14/04* (2006.01)
*H01L 51/00* (2006.01)
*H01L 51/56* (2006.01)
*H01L 51/52* (2006.01)

(52) U.S. Cl.
CPC ........ *C23C 14/042* (2013.01); *H01L 51/0011* (2013.01); *H01L 51/5237* (2013.01); *H01L 51/56* (2013.01)

(58) Field of Classification Search
CPC .................................................. H01L 51/0011
See application file for complete search history.

(56) References Cited

U.S. PATENT DOCUMENTS

| | | | |
|---|---|---|---|
| 7,442,258 B2 | 10/2008 | Kim | |
| 2004/0104197 A1* | 6/2004 | Shigemura | C23C 14/042 216/20 |
| 2018/0148844 A1 | 3/2018 | Yoo et al. | |
| 2019/0100834 A1* | 4/2019 | Sakio | B23K 11/11 |

FOREIGN PATENT DOCUMENTS

| | | |
|---|---|---|
| KR | 10-0510691 | 8/2005 |
| KR | 10-0525819 | 11/2005 |
| KR | 10-2015-0032087 | 3/2015 |
| KR | 10-2018-0062486 | 6/2018 |
| KR | 10-1869889 | 6/2018 |

* cited by examiner

*Primary Examiner* — Robert A Vetere
(74) *Attorney, Agent, or Firm* — H.C. Park & Associates, PLC

(57) ABSTRACT

Provided are a method of manufacturing a mask that has a high precision configured to minimize a shadow effect, and a method of manufacturing a display device. The method of manufacturing a mask includes: tensioning a mask sheet; bonding the mask sheet that is tensioned to a mask frame; and forming an opening in the mask sheet by irradiating laser light on the mask sheet such that an inner wall of the opening has a slope with respect to a surface of the mask sheet.

7 Claims, 18 Drawing Sheets

INCIDENCE DIRECTION OF
DEPOSITION MATERIAL

METHOD OF MANUFACTURING MASK AND METHOD OF MANUFACTURING DISPLAY DEVICE

CROSS-REFERENCE TO RELATED APPLICATION

This application claims priority from and the benefit of Korean Patent Application No. 10-2020-0031315, filed on Mar. 13, 2020, which is hereby incorporated by reference for all purposes as if fully set forth herein.

BACKGROUND

Field

Exemplary embodiments and implementations of the invention relate generally to method of manufacturing a mask and a method of manufacturing a display device, and, more specifically, to a method of manufacturing a mask which may obtain a mask having high precision, and a method of manufacturing a display device using the method.

Discussion of the Background

Mobile electronic apparatuses are widely in use. As mobile electronic apparatuses, not only miniaturized electronic apparatuses such as mobile phones but also tablet personal computers (PC) have been widely used recently.

To support various functions, the mobile electronic apparatuses include a display device to provide a user with visual information such as an image. Recently, because parts driving a display device are miniaturized, the proportion of the display device in an electronic apparatus gradually increases and a structure that may be bent to have a predetermined angle from a flat state is also under development.

Generally, while manufacturing a display device including an organic light-emitting display device, various layers are formed through a method such as deposition. For example, in an organic light-emitting display device, a metal layer, etc. are formed on a substrate by using a deposition apparatus during a manufacturing process. During this process, a deposition material is deposited on a portion of the substrate set in advance by using a mask including an opening pattern.

A method of forming the opening pattern of the mask may use wet etching. However, in the case of the wet etching, it may be difficult to manufacture a fine pattern due to non-uniformity of an etching process.

The above information disclosed in this Background section is only for understanding of the background of the inventive concepts, and, therefore, it may contain information that does not constitute prior art.

SUMMARY

One or more embodiments include a method of manufacturing a mask that has a high precision and may minimize a shadow effect, and a method of manufacturing a display device. However, it should be understood that embodiments described herein should be considered in a descriptive sense only and not for limitation of the disclosure.

Additional features of the inventive concept will be set forth in the description which follows and, in part, will be apparent from the description, or may be learned by practice of the presented embodiments of the disclosure.

According to one or more embodiments, a method of manufacturing a mask includes tensioning a mask sheet, bonding the mask sheet that is tensioned to a mask frame, and forming an opening in the mask sheet by irradiating laser light on the mask sheet such that an inner wall of the opening has a slope with respect to a surface of the mask sheet.

The forming of the opening may include forming a first opening by irradiating the laser light at a first position on the mask sheet, and forming a second opening by irradiating the laser light at a second position, the second position being apart from the first position by a first distance in a first direction and being apart from the first position by a second distance in a second direction intersecting the first direction, wherein the first distance and the second distance include distances corrected from information about a desired position of the second opening based on an offset correction value.

The forming of the opening may include forming a first group of openings in an outside area along an edge of the mask sheet, and sequentially forming a second group of openings inside the first group of openings.

The forming of the opening may include forming a first opening, and forming a second opening in point symmetrical with the first opening with respect to a reference point at a center of the mask sheet.

The method may further include inverting the mask frame, and chamfering an edge between the one surface of the mask sheet and the inner wall of the opening.

According to one or more embodiments, a method of manufacturing a display device includes preparing a mask assembly, arranging the mask assembly to face a substrate, closely attaching the mask assembly to the substrate, and supplying, by a deposition source, a deposition material to pass through the mask assembly to deposit the deposition material on the substrate, wherein the mask assembly includes a mask frame, and a mask sheet including a plurality of openings and having edges bonded to the mask frame, a first portion of the mask sheet located between two adjacent openings includes a first surface, a second surface, and a lateral surface, the first surface facing the mask frame, the second surface being opposite to the first surface, and the lateral surface connecting the first surface to the second surface, and a first angle between the lateral surface and the second surface is less than a second angle at which the deposition material is incident to the substrate.

The preparing of the mask assembly may include tensioning the mask sheet, bonding the mask sheet that is tensioned to the mask frame, and forming an opening in the mask sheet by irradiating laser light on the mask sheet.

The forming of the opening may include forming a first opening by irradiating the laser light at a first position on the mask sheet, and forming a second opening by irradiating the laser light at a second position, the second position being apart from the first position by a first distance in a first direction and being apart from the first position by a second distance in a second direction intersecting the first direction, wherein the first distance and the second distance may include distances corrected from information for a desired position of the second opening based on an offset correction value.

The forming of the opening may include forming a first group of openings in an outside area along an edge of the mask sheet, and sequentially forming a second group of openings inside the first group of openings.

The forming of the opening may include forming a first opening, and forming a second opening in point symmetrical with the first opening with respect to a reference point at a center of the mask sheet.

The mask sheet may further include a second portion protruding in an opposite direction of the mask frame from the first portion.

A surface of the second portion may be closer to the substrate than the second surface of the first portion.

A width of the surface of the second portion may be less than a width of the second surface of the first portion.

The second angle may include an angle at which the deposition material is incident with respect to the substrate through the opening of the mask sheet that is farthest away from the deposition source in a plan view.

The deposition material deposited on the substrate may form an electrode or a thin-film encapsulation layer of the display device including an organic light-emitting diode.

These and/or other aspects will become apparent and more readily appreciated from the following description of the embodiments, the accompanying drawings, and claims.

These general and specific aspects may be implemented by using a system, a method, a computer program, or a combination of a certain system, method, and computer program.

It is to be understood that both the foregoing general description and the following detailed description are exemplary and explanatory and are intended to provide further explanation of the invention as claimed.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
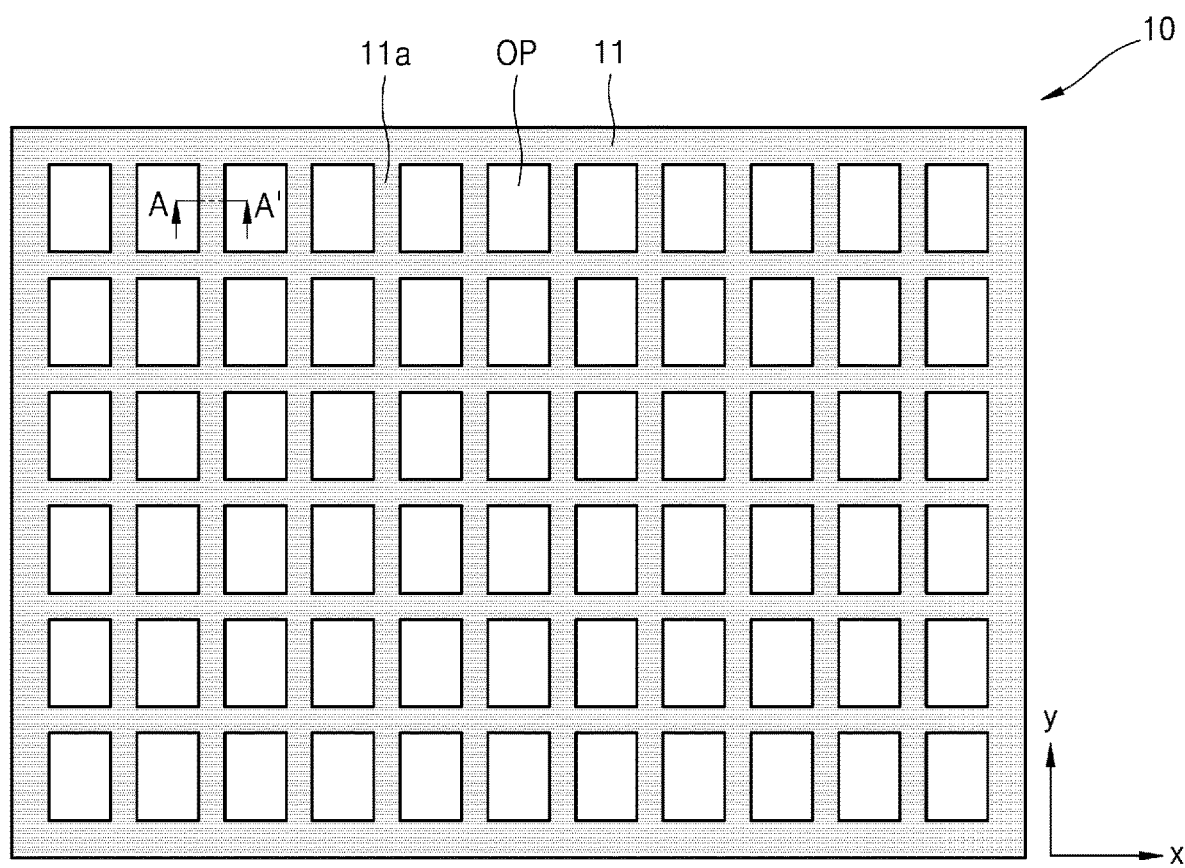
FIG. 1 is a plan view illustrating a mask manufactured by using a method of manufacturing a mask according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a mask 10 manufactured by using a method of manufacturing a mask according to an embodiment.

Referring to FIG. 1, the mask 10 manufactured by using a method of manufacturing a mask according to the present embodiment may have a flat plate shape including a plurality of openings OP. The mask 10 may include the plurality of openings OP formed in a mask sheet 11. The mask sheet 11 may be a metal sheet.

The mask 10 may be used during a thin-film deposition process of stacking the same material on an entire area of a display substrate and patterning the display substrate to manufacture a display device. During the thin-film deposition process, a stacked material may pass through an opening OP of the mask 10 and be stacked on a substrate close to the mask 10.

Though the opening OP of the mask 10 has a rectangular shape in FIG. 1, this is a mere example and the opening OP may have various shapes such as a circular shape, an elliptical shape, and a polygonal shape. Furthermore, in the case of manufacturing various display devices having a shape obtained from a rectangular shape or having an asymmetric shape, the opening OP may have a corresponding shape to the display device.

The mask 10 may include a first portion 11a of the mask sheet 11 located between openings OP neighboring each other. A cross-sectional shape of the first portion 11a is described below in detail with reference to FIGS. 7A and 7B.

Figure 2:
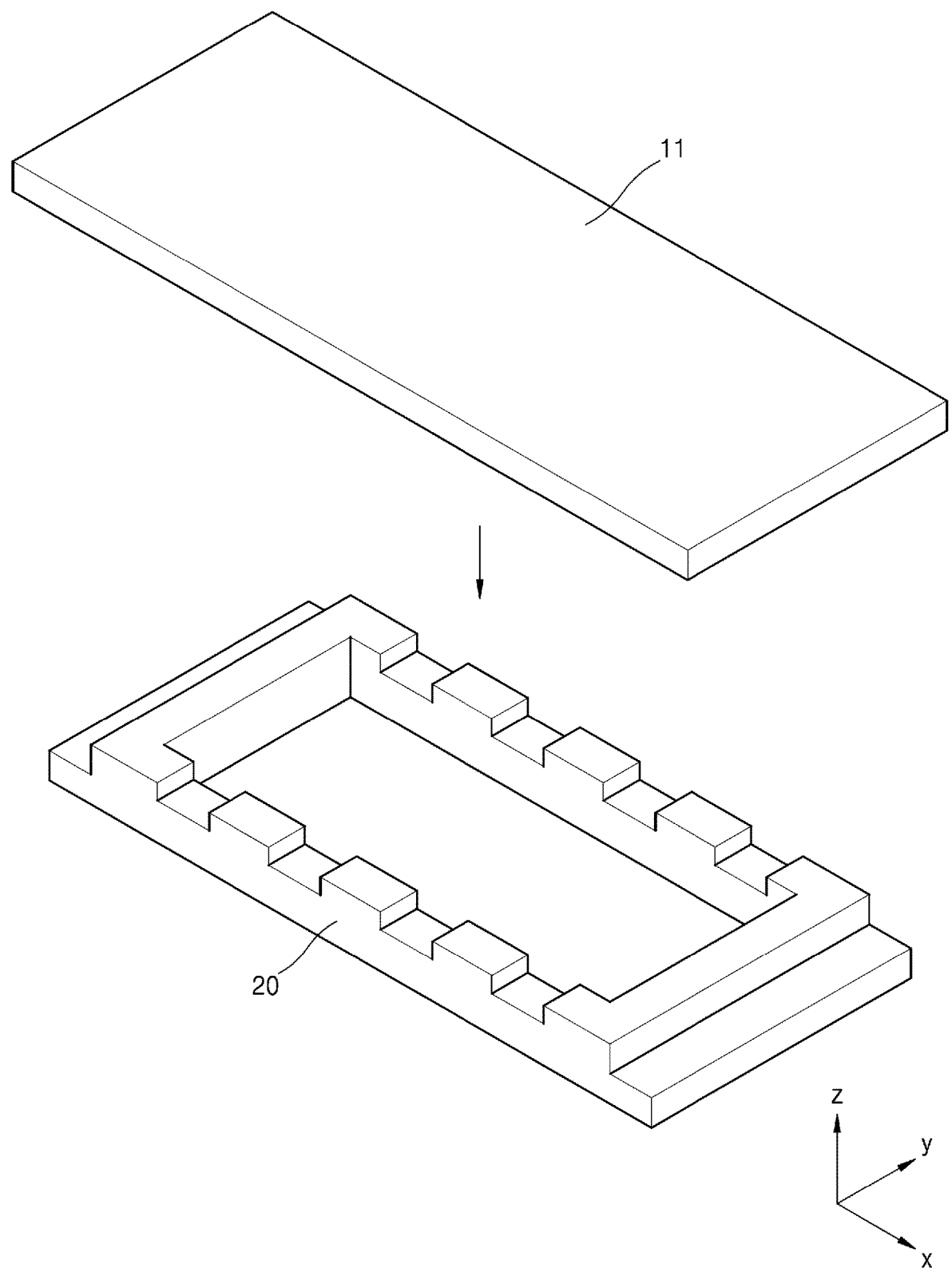
FIG. 2 is a perspective view illustrating a mask sheet and a mask frame according to an embodiment.

FIG. 2 is a perspective view of a mask sheet 11 and a mask frame 20 according to an embodiment.

To manufacture the mask 10 (see FIG. 1) according to the present embodiment, the mask sheet 11 is prepared first. The mask sheet 11, which is an object to be processed, may include an INVAR alloy and have a flat plate shape having a thickness of about tens of micrometers.

The mask sheet 11 may be seated and fixed on the mask frame 20. The mask frame 20 may support the mask sheet 11 by contacting the mask sheet 11 in a region in which the openings are not formed among the entire region of the mask sheet 11. For example, the mask frame 20 may support the edge of the mask sheet 11.

Figure 3A:
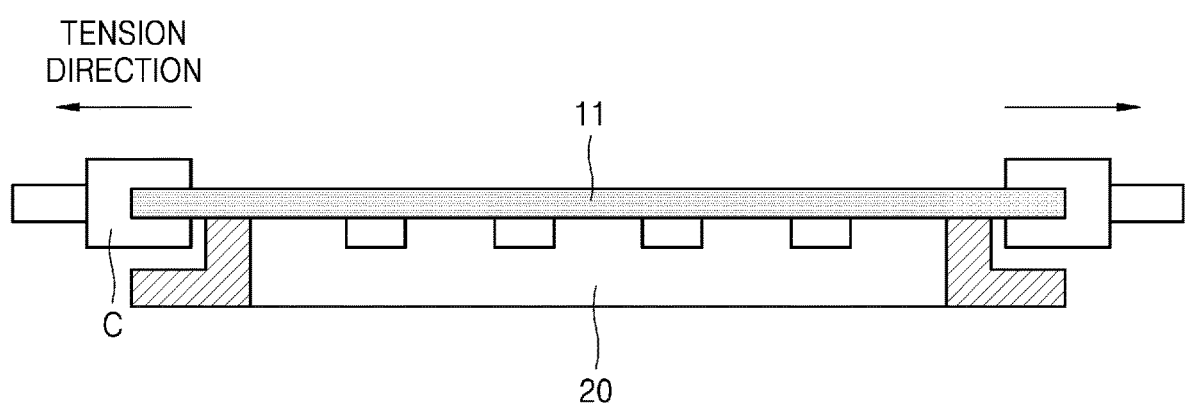
FIGS. 3A to 3C are cross-sectional views illustrating a process of manufacturing a mask according to an embodiment.
Figure 3B:
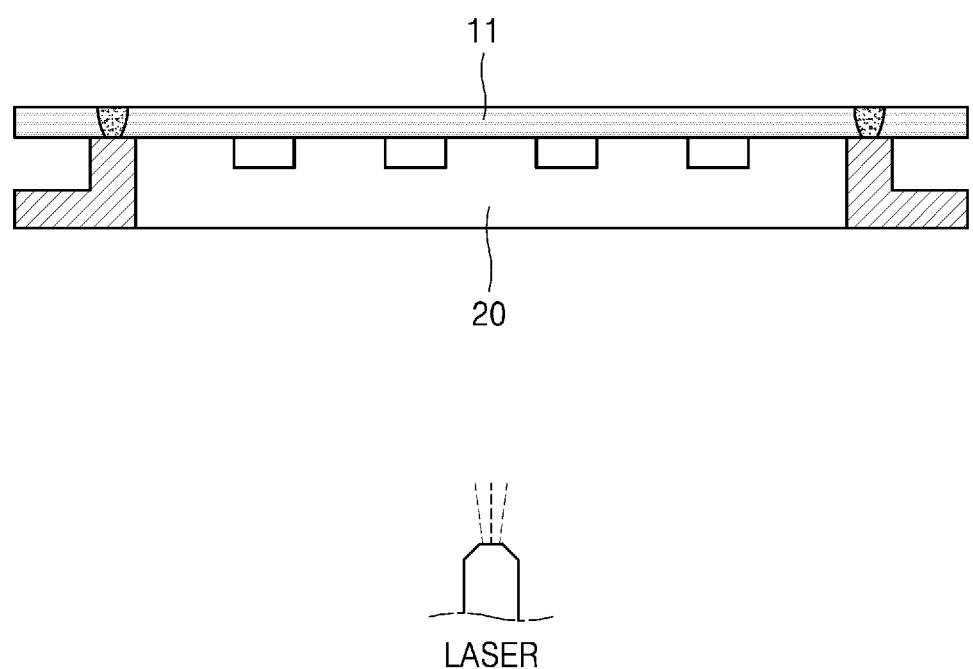
Figure 3C:
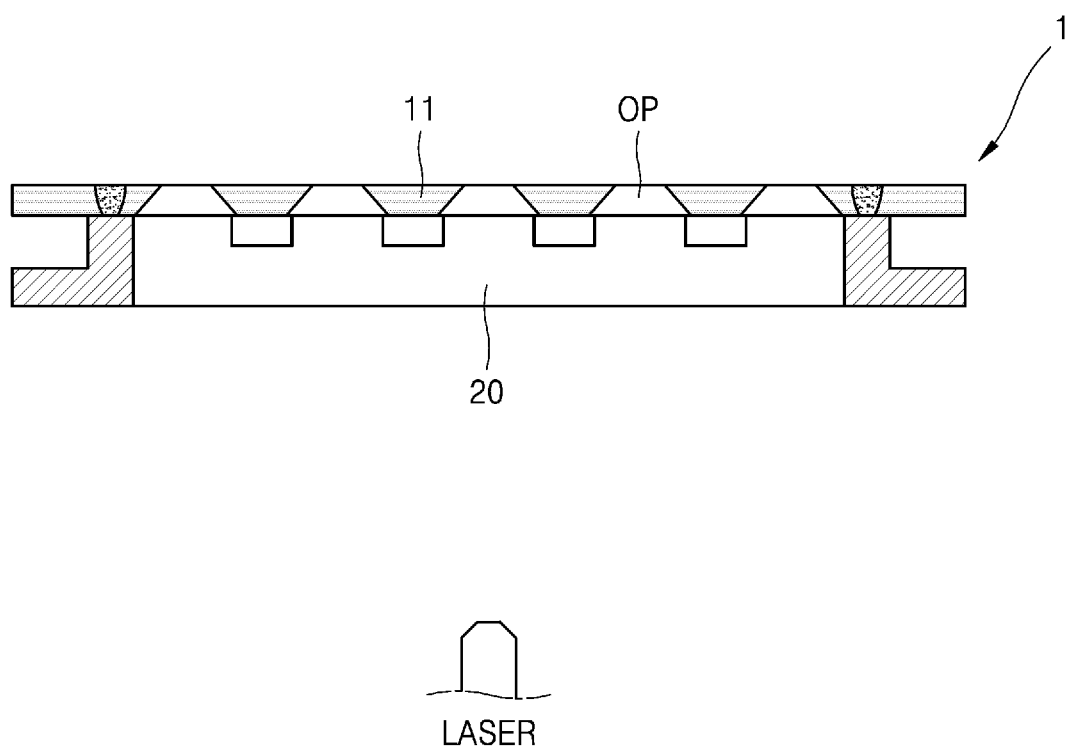

FIGS. 3A to 3C are cross-sectional views illustrating a process of manufacturing the mask 10 according to an embodiment.

Referring to FIG. 3A, the mask sheet 11 may be tensioned and fixed to the mask frame 20. For a precise thin-film deposition process, the mask 10 may have a flat shape to be uniformly closely attached to a display substrate D (illustrated in FIG. 8). However, because the mask sheet 11 has a very thin thickness, when the mask sheet 11 is fixed to the mask frame 20 to form the openings OP, the mask sheet 11 may be bent or twisted due to sagging thereof. To prevent sagging of the mask sheet 11, the edges of the mask sheet 11 may be gripped by using clamps C and tensioned in a lengthwise direction of the mask sheet 11 or four directions. The mask sheet 11 that is tensioned may be bonded to the mask frame 20. In this case, the mask sheet 11 may be fixed to the mask frame 20 by using welding. For example, a laser may be used to weld the mask sheet 11.

Referring to FIG. 3B, a laser configured to form the opening OP in the mask sheet 11 may be arranged on a side of the mask sheet 11 bonded to the mask frame 20 with the mask sheet 11 tensioned. For example, the laser may be arranged above or below the mask sheet 11. The laser may form the opening OP by irradiating laser light to the mask sheet 11. An inner wall of the opening OP may be formed to have a slope with respect to a surface of the mask sheet 11. The inner wall of the opening OP may correspond to a lateral surface Sa3 of the first portion 11a of the mask sheet 11 described below with reference to FIGS. 7A and 7B.

Compared to the case of forming the opening OP through wet etching as a comparative example, in the case of forming the opening OP by using a laser according to an embodiment, a precise processing is possible and the accuracies of a location, a shape, etc. of the opening OP may be improved. In addition, an etching condition may change depending on a material of the mask sheet 11 in the case of wet etching. Therefore, in the case of processing the mask sheet 11 including various materials, it may be more efficient to use a laser according to embodiments described herein.

In an embodiment, the mask frame 20 and the mask sheet 11 may be inverted. Then an edge formed by one surface of the mask sheet 11 and the inner wall of the opening OP may be chamfered or right-angle chamfered by using a laser. Through this process, as described below with reference to FIG. 7B, a cross-sectional shape of the first portion 11a of the mask sheet 11 may be obtained.

Referring to FIG. 3C, a mask assembly 1 including the mask frame 20 and the mask sheet 11 may be obtained through the above process, the mask sheet 11 including the plurality of openings OP and having edges thereof bonded to the mask frame 20.

As a comparative example, in the case of forming the opening OP in the mask sheet 11 by using wet etching and then tensioning the mask sheet 11, transformation of the mask sheet 11 may be caused by tensile force and thus an error may be caused to the location, the shape, etc. of the opening OP that is already formed. Therefore, it may be difficult to obtain the opening OP of desired accurate location and shape.

However, according to an embodiment, because the opening OP is formed by using a laser with the tensions mask sheet 11 and the transformation of the mask sheet 11 caused by tensile force may be taken into account in the operation of forming the opening OP, more accurate and precise location and shape of the opening OP may be obtained.

Figure 4A:
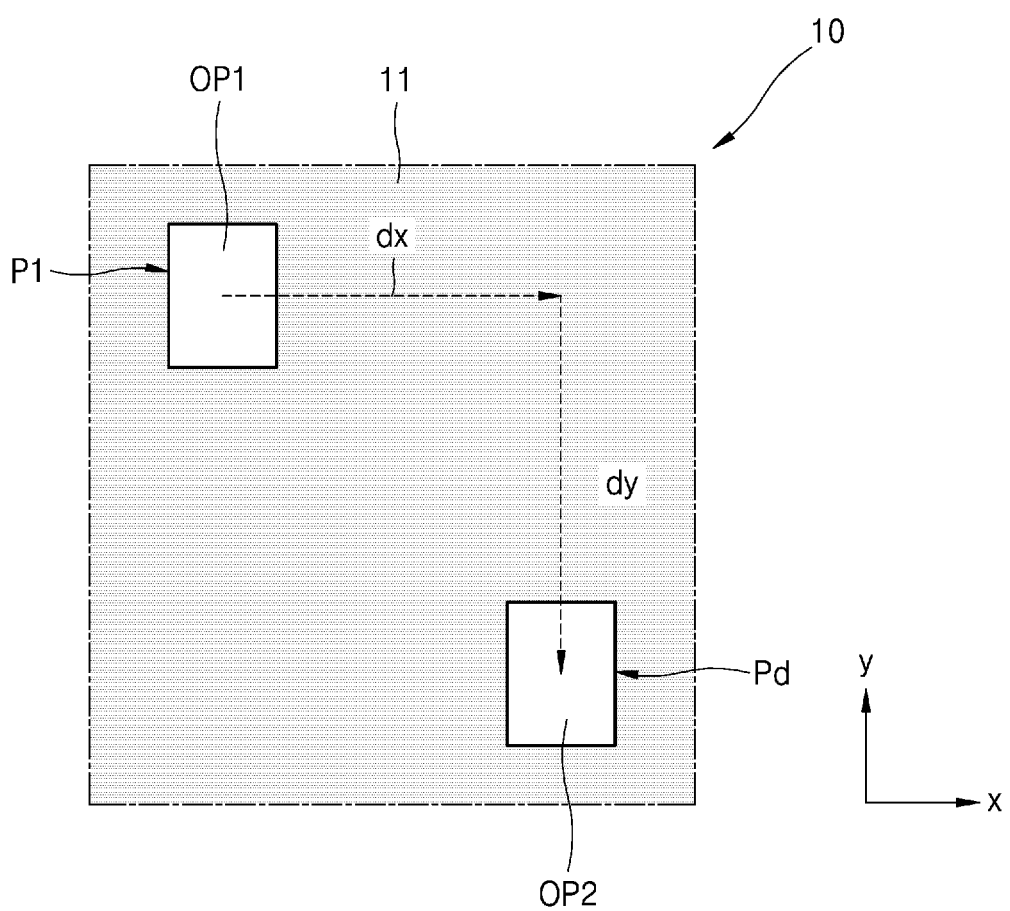
FIGS. 4A and 4B are plan views illustrating a process of manufacturing a mask according to an embodiment.
Figure 4B:
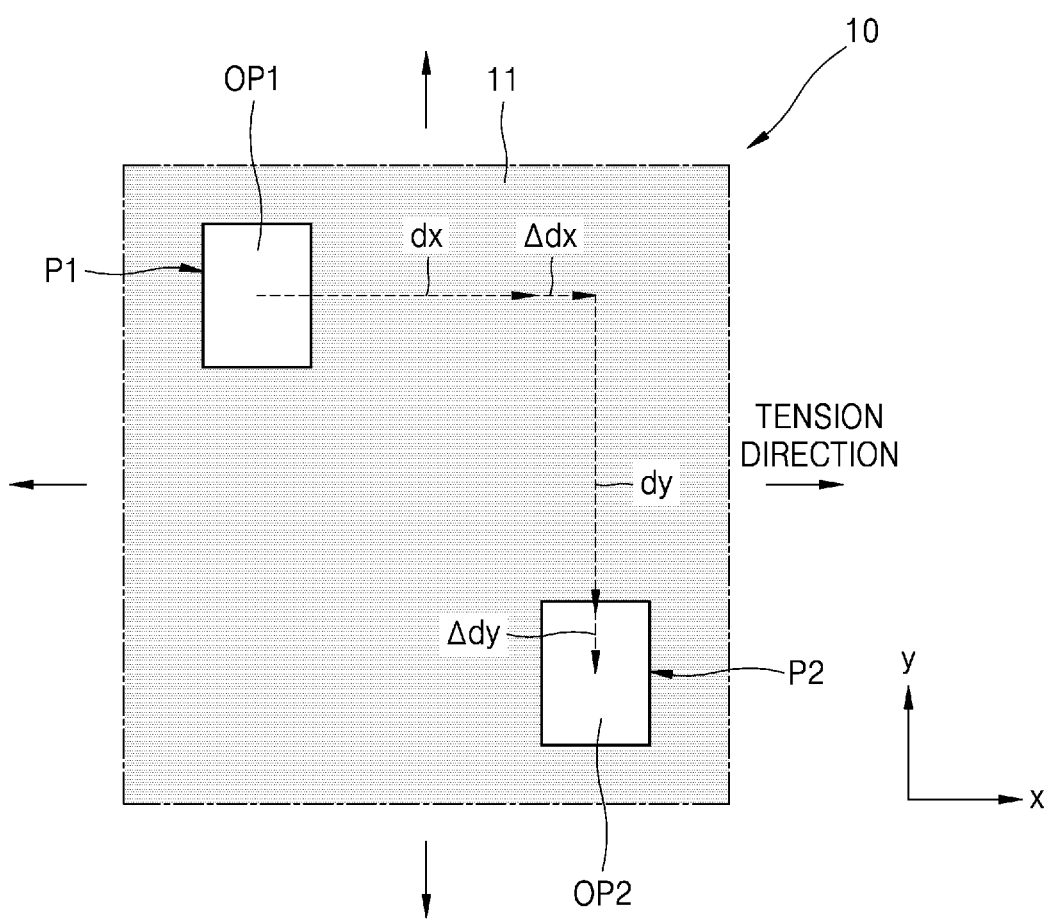

FIGS. 4A and 4B are plan views illustrating a process of manufacturing a mask according to an embodiment.

Referring to FIG. 4A, a first opening OP1 may be formed by irradiating laser light to a first position P1 on the mask sheet 11. Next, to form a second opening OP2 at a desired position Pd, laser light may be irradiated at a position apart from the first position P1 by a first distance dx in a first direction x and apart from the first position P1 by a second distance dy in a second direction y. The first distance dx and the second distance dy may be denoted by information regarding the desired position Pd of the second opening OP2.

Referring to FIG. 4B, a process of forming the opening OP in the mask sheet 11 that is tensioned is illustrated. A tensile force may be applied to the mask sheet 11 in which the opening OP is not yet formed, and stress caused by the tensile force may be uniformly distributed. Under this case, when the first opening OP1 is formed at the first position P1 on the mask sheet 11 that is tensioned, stress distribution changes inside the mask sheet 11 and the mask sheet 11 may be partially transformed.

Because the mask sheet 11 may be partially transformed after the first opening OP1 is formed by irradiating laser light to the first position P1, even though laser light is irradiated at a position apart from the first position P1 by the first distance dx in the first direction x and apart from the first position P1 by the second distance dy in the second direction y, the second opening OP2 may not be formed at a desired position on the mask sheet 11. Therefore, compensation for the transformation of the mask sheet 11 may be required.

Though two openings OP1 and OP2 are illustrated, embodiments are not limited thereto. As described herein, multiple openings may be formed and compensation data used to form additional openings at desired locations on the mask sheet 11.

Referring to FIG. 4B, after the first opening OP1 is formed by irradiating laser light at the first position P1 on the mask sheet 11, the second opening OP2 may be formed by irradiating laser light at the second position P2 apart from the first position P1 by a first correction distance dx+Δdx in the first direction x and apart from the first position P1 by a second correction distance dy+Δdy in the second direction y. The first correction distance dx+Δdx and the second correction distance dy+Δdy may include distances corrected from the first distance dx and the second distance dy based on offset correction values Δdx and Δdy.

According to an embodiment, the offset correction values Δdx and Δdy may have positive or negative values and be obtained based on physical properties of a material of the mask sheet 11, a thickness of the mask sheet 11, a tensile force tensioning the mask sheet 11, the number of openings OP formed in the mask sheet 11, a forming position and a forming sequence of the opening OP, etc. For example, when the material of the mask sheet 11 has physical properties that are strong against transformation or has a high thickness, a transformation degree of the mask sheet 11 is small and thus sizes of the offset correction values Δdx and Δdy may be small.

In addition, when tensile force applied to the mask sheet 11 is large or the number of openings OP formed in the mask sheet 11 is large, a transformation degree of the mask sheet 11 becomes large and the sizes of the offset correction values Δdx and Δdy may become large. In addition, because a transformation degree, a position at which transformation additionally occurs, etc. change depending on the forming position and the forming sequence of the openings OP of the mask sheet 11, the offset correction values Δdx and Δdy may be set by taking into account these.

As described above, because the opening OP is formed by using a laser with the mask sheet 11 tensioned first, transformation of the mask sheet 11 caused by tensile force may be taken into account in an operation of forming the opening OP. Also, because a position at which a laser is irradiated is corrected by taking into account the transformation of the mask sheet 11 based on the offset correction values Δdx and Δdy, more accurate and precise position and shape of the opening OP may be obtained. In addition, because the transformation of the mask sheet 11 may be taken into account in the operation of forming the opening OP, a more accurate opening OP may be obtained at one time of a laser process.

Figure 5A:
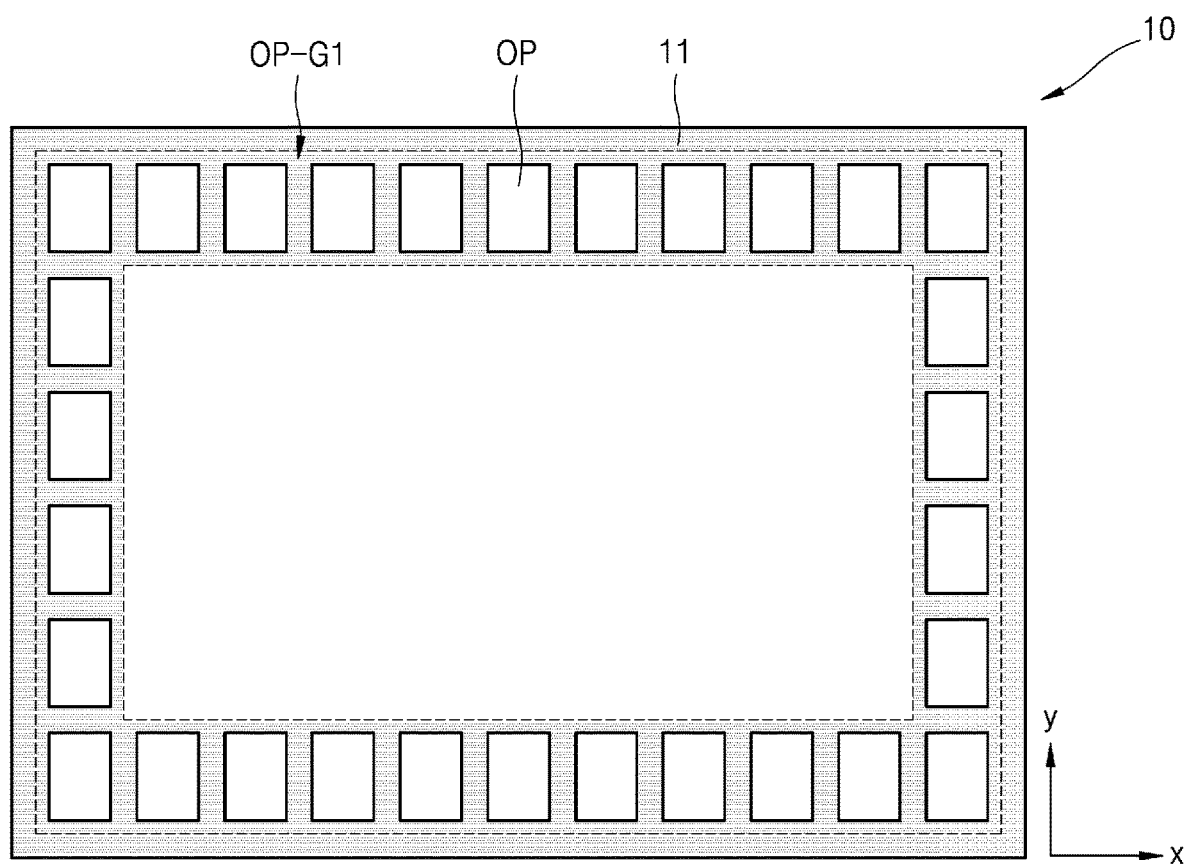
FIGS. 5A and 5B are plan views illustrating a process of manufacturing a mask according to an embodiment.
Figure 5B:
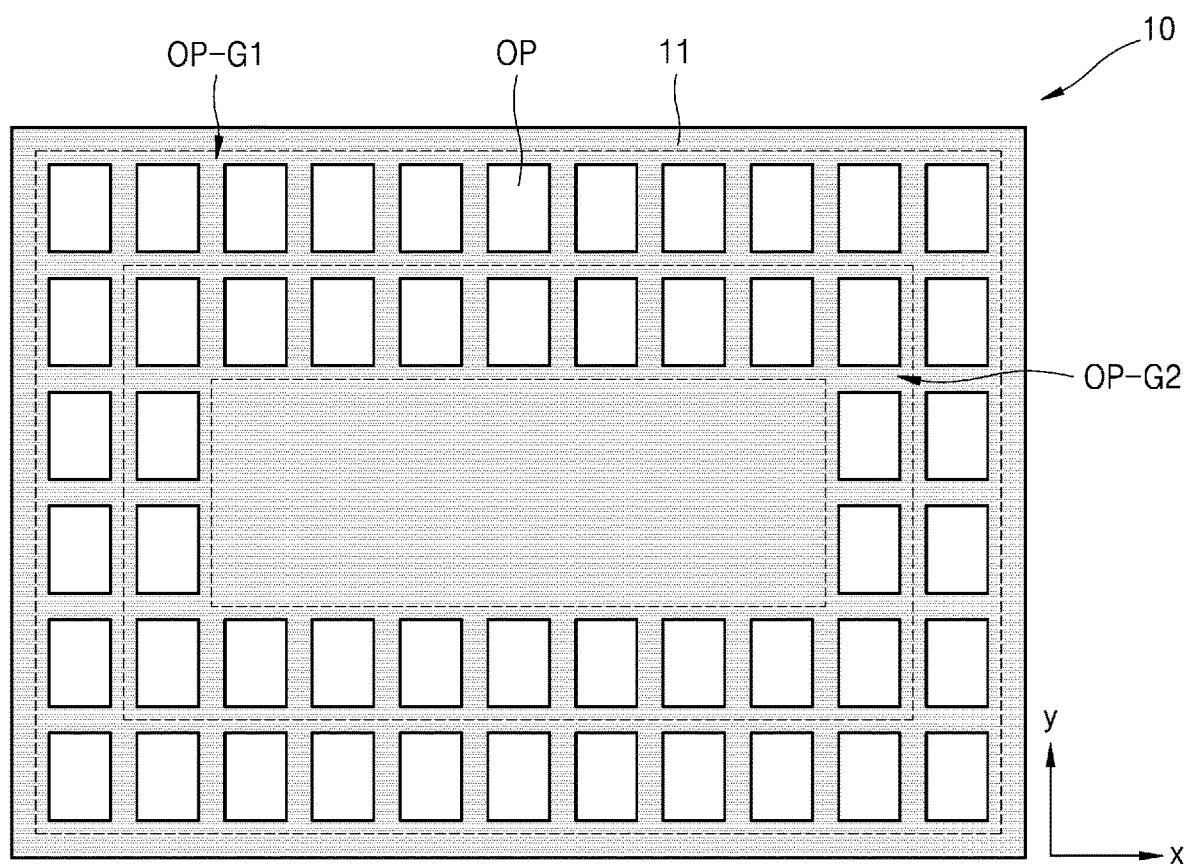

FIGS. 5A and 5B are plan views illustrating a manufacturing sequence in a process of manufacturing a mask according to an embodiment.

Referring to FIG. 5A, a first group of openings OP-G1 may be formed in an outside area along the edge of the first mask sheet 11. The first group of openings OP-G1 may be defined by the dotted lines illustrated in the drawing. When forming each of the first group of openings OP-G1, the openings may be formed by reflecting the offset correction values Δdx and Δdy as described above. The first group of openings OP-G1 may be sequentially formed in a clockwise direction or a counterclockwise direction, and as described below with reference to FIGS. 6A and 6B, the first group of openings OP-G1 may be sequentially formed while forming point symmetry. Alternatively, it is possible to form the openings OP on a side of the mask sheet 11 first, and then form the openings OP on the opposite side of the mask sheet 11, thereby forming the openings OP on all four sides of the mask sheet 11.

Referring to FIG. 5B, subsequent to forming of the first group of openings OP-G1, a second group of openings OP-G2 arranged inside the first group of openings OP-G1 may be sequentially formed. When forming each of the second group of openings OP-G2, the second group of openings may be formed by reflecting the offset correction values Δdx and Δdy as described above. A forming order may be like the case of the first group of openings OP-G1. In this way, openings OP located at the edge of the mask sheet 11 may be formed first, and openings OP located at the center of the mask sheet 11 may be finally formed. As an alternative example, openings OP located at the central portion of the mask sheet 11 may be formed first, and openings OP located at the edges of the mask sheet 11 may be finally formed. In this case, the order of forming the first group of openings OP-G1 and the second group of openings OP-G2 may be reversed, that is, after the second group of openings OP-G2 are formed, the first group of openings OP-G1 may be formed later.

Stress imbalance and transformation imbalance inside the mask sheet 11 caused by tensile force may be minimized by sequentially forming the openings OP symmetrically as described above. Through this, process precision reduction caused by imbalance when forming the openings OP may be reduced and more accurate position and shape of the openings OP may be obtained.

Figure 6A:
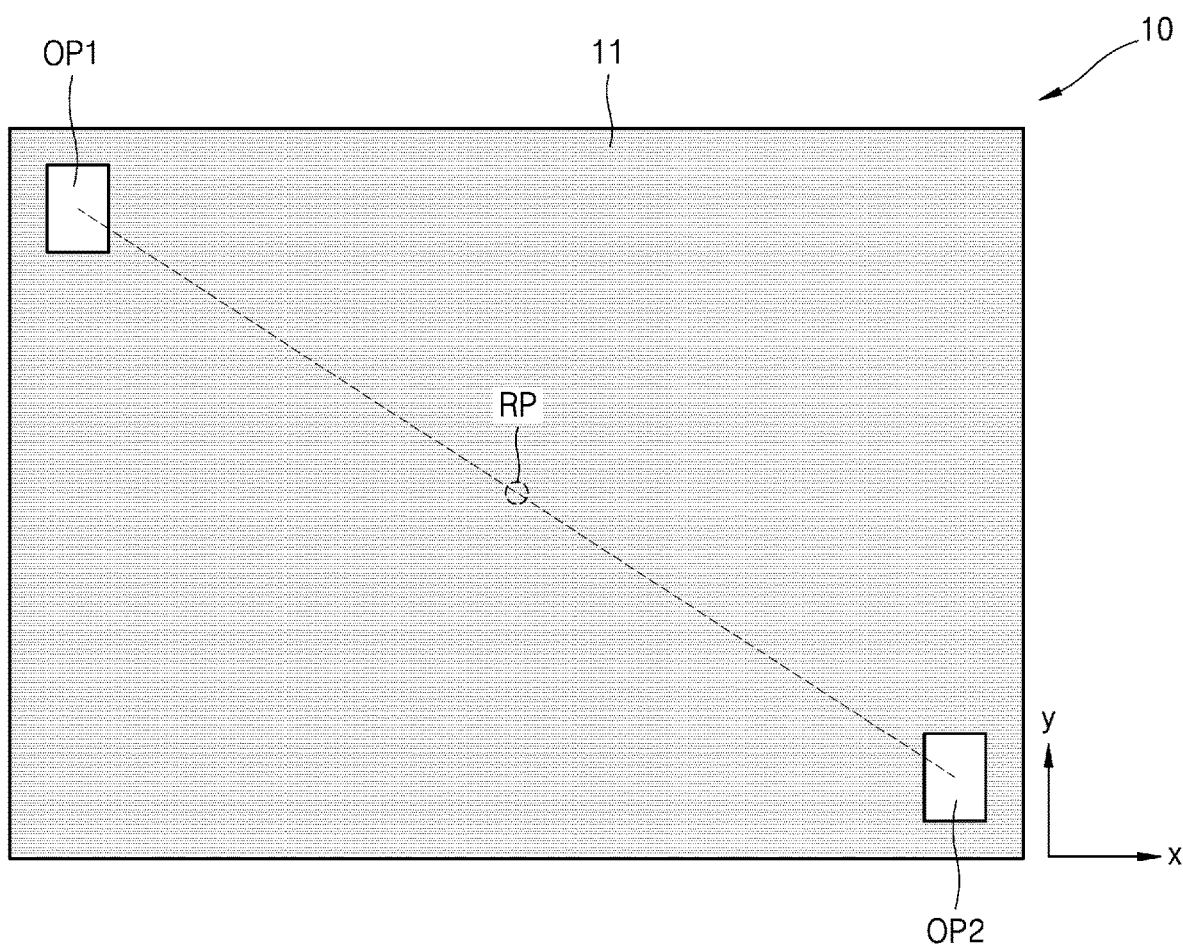
FIGS. 6A and 6B are plan views illustrating a process of manufacturing a mask according to another embodiment.
Figure 6B:
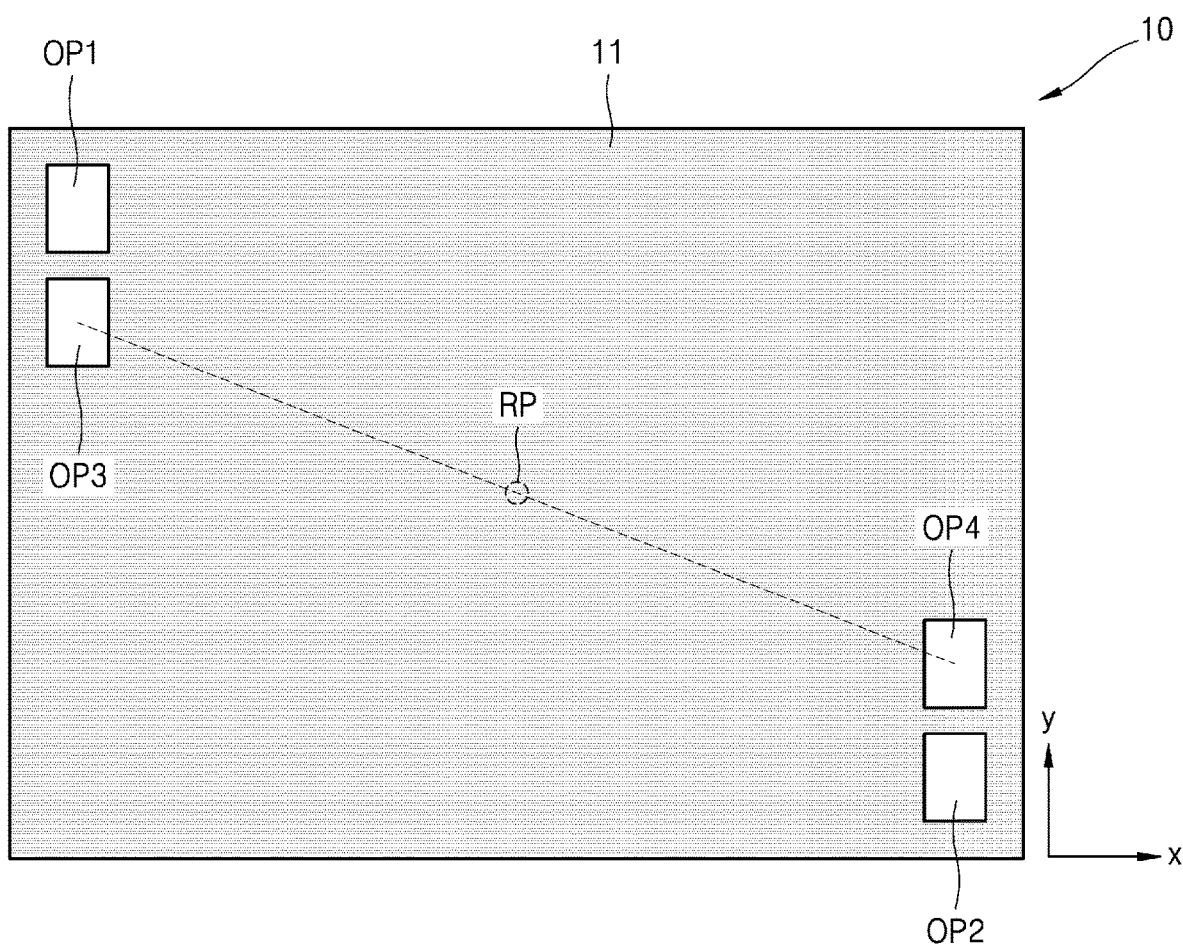

FIGS. 6A and 6B are plan views illustrating a manufacturing order of a process of manufacturing a mask according to another embodiment.

Referring to FIG. 6A, the first opening OP1 may be formed first in the mask sheet 11. Next, the second opening OP2 may be formed, the second opening OP2 being at a point-symmetrical position of the first opening OP1 around a reference point RP positioned at the center of the mask sheet 11.

Referring to FIG. 6B, a third opening OP3 positioned near the first opening OP1 may be sequentially formed. A fourth opening OP4 may be formed, the fourth opening OP4 being at a point-symmetrical position of the third opening OP3 around a reference point RP positioned at the center of the mask sheet 11. Here, the order of forming the third opening OP3 and the fourth opening OP4 may be changed.

Stress imbalance and transformation imbalance inside the mask sheet 11 caused by tensile force may be minimized by sequentially forming the openings OP symmetrically as described above. Through this, process precision reduction caused by imbalance when forming the openings OP may be reduced and more accurate position and shape of the openings OP may be obtained.

Figure 7A:
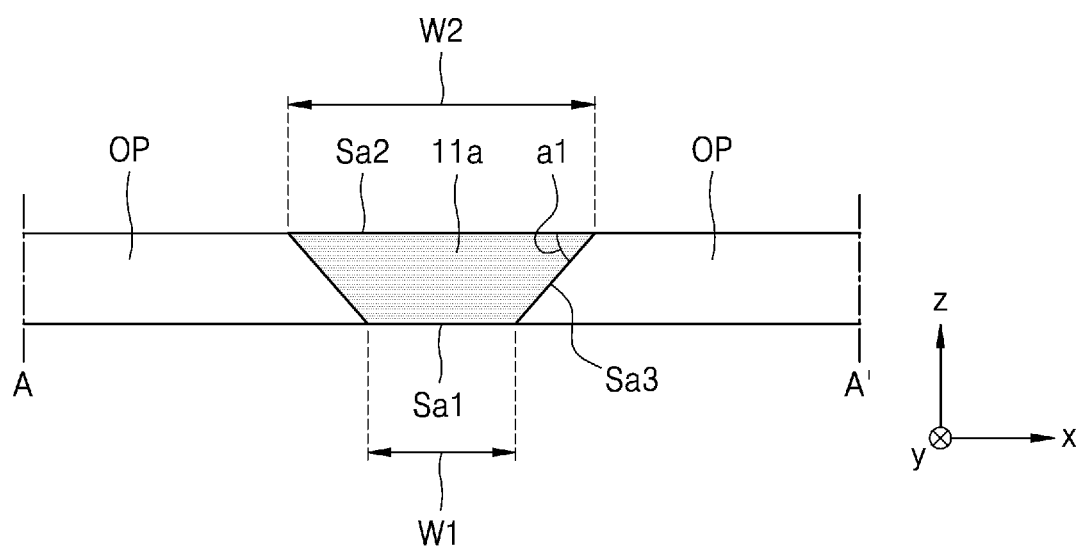
FIG. 7A is a cross-sectional view of a portion of a mask of FIG. 1 according to an embodiment.

FIG. 7A is a cross-sectional view of a portion of the mask of FIG. 1 according to an embodiment. FIG. 7A may correspond to a cross-section A-A' of the mask of FIG. 1.

The mask sheet 11 may include the openings OP and include the first portion 11a located between two openings OP neighboring each other. FIG. 7A illustrates a cross-section of the first portion 11a of the mask sheet 11. The first portion 11a may include a first surface Sa1, a second surface Sa2, and a lateral third surface Sa3. The first surface Sa1 faces the mask frame 20, the second surface Sa2 is opposite to the first surface Sa1, and the lateral third surface Sa3 connects the first surface Sa1 to the second surface Sa2.

In an embodiment, the lateral third surface Sa3 may have a slope with respect to the second surface Sa2, and a first angle a1 formed by the lateral third surface Sa3 and the second surface Sa2 may be less than 90°. In addition, in an embodiment, a width W1 of the first surface Sa1 may be less than a width W2 of the second surface Sa2. In another embodiment, when desired, an angle formed by the lateral third surface Sa3 and the first surface Sa1 may be less than 90°, and the width W2 of the second surface Sa2 may be less than the width W1 of the first surface Sa1.

Figure 7B:
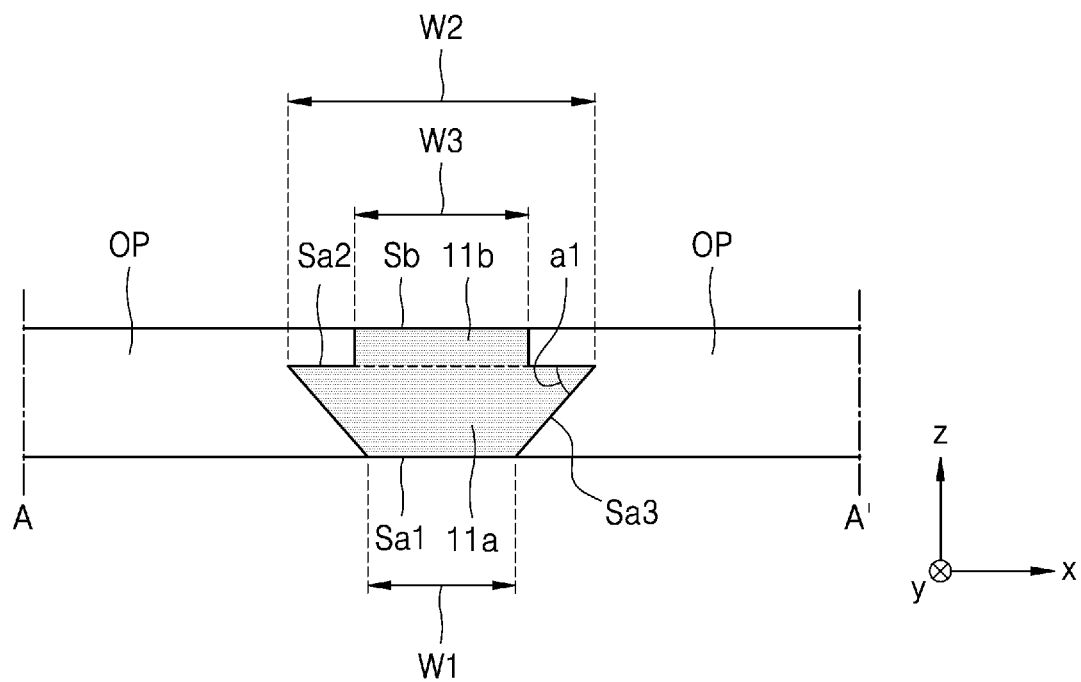
FIG. 7B is a cross-sectional view of a portion of a mask of FIG. 1 according to another embodiment.

FIG. 7B is a cross-sectional view of a portion of the mask of FIG. 1 according to another embodiment. FIG. 7B may correspond to a cross-section A-A' of the mask of FIG. 1. Hereinafter, the same descriptions as those of FIG. 7A are omitted and differences are mainly described.

The mask sheet 11 may further include a second portion 11b protruding in the opposite direction of the mask frame 20 from the first portion 11a. The second portion 11b may have a rectangular cross-section but embodiments are not limited thereto. The second portion 11b may have a polygonal cross-section of various shapes, and a fourth surface Sb of the second portion 11b protruding from the first portion 11a may be flat. A width W3 of the fourth surface Sb of the second portion 11b may be less than the width W2 of the second surface Sa2 of the first portion 11a. The first portion 11a and the second portion 11b may be formed as one body. For example, the cross-sectional shape of FIG. 7B may be obtained by right-angle chamfering the edges in which the lateral third surface Sa3 meets the second surface Sa2 in the cross-sectional shape of the first portion 11a of FIG. 7A. Edges in which the lateral third surface Sa3 meets the second surface Sa2 may be chamfered.

In the case of forming the openings OP of the mask sheet 11 by using a laser, the mask sheet 11 may be processed such that the first portion 11a and/or the second portion 11b of the mask sheet 11 have cross-sections of various shapes. The shapes may be formed by adjusting the intensity of laser light and a focal depth of the laser light in the thickness direction of the mask sheet 11, etc.

Figure 8:
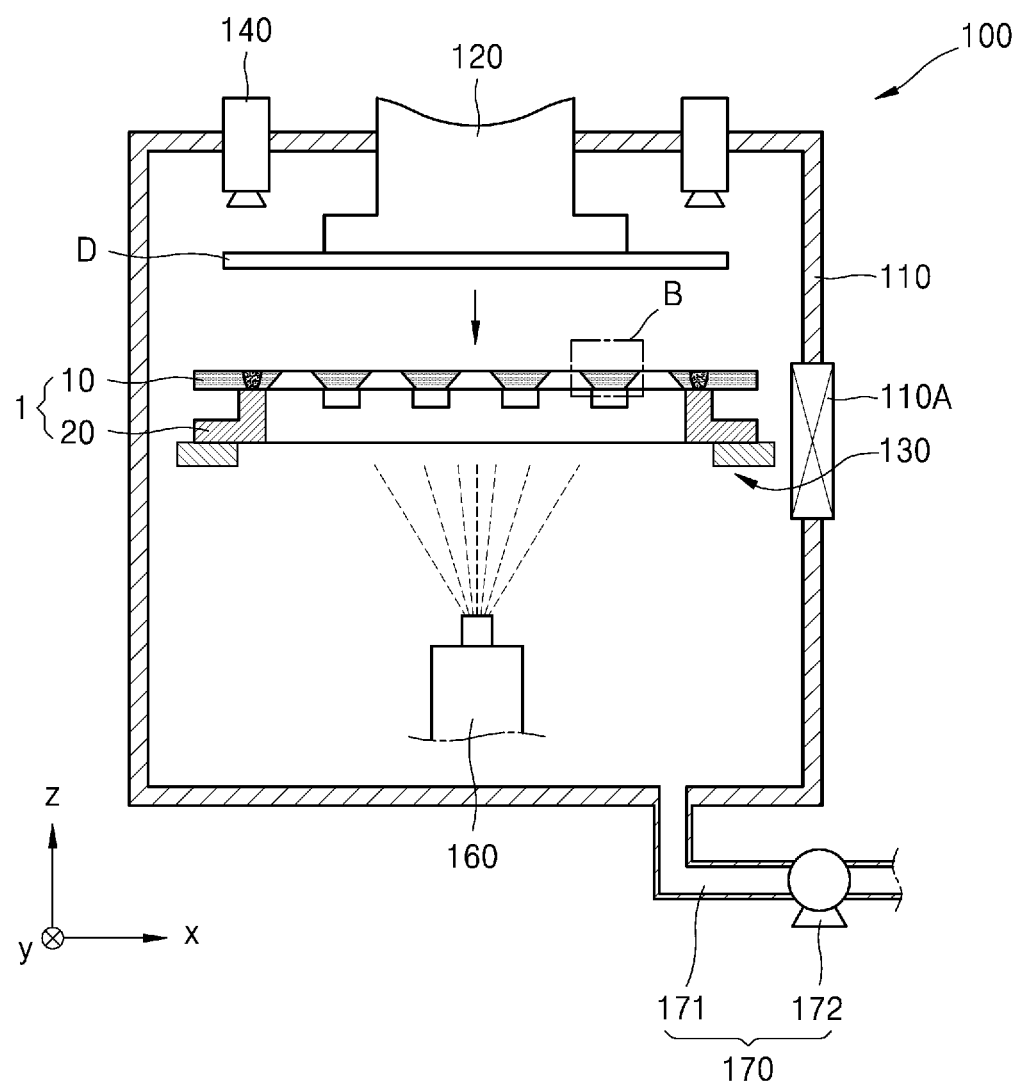
FIG. 8 is a cross-sectional view of an apparatus configured to manufacture a display device including a mask assembly according to an embodiment.

FIG. 8 is a cross-sectional view of an apparatus 100 configured to manufacture a display device including the mask assembly 1 according to an embodiment.

Referring to FIG. 8, the apparatus 100 configured to manufacture a display device may include a chamber 110, a first support 120, a second support 130, a vision unit 140, the mask assembly 1, a deposition source 160, and a pressure adjuster 170.

The chamber 110 may include a space therein and a portion of the chamber 110 may be open. A gate value 110A may be installed at the open portion of the chamber 110 to selectively open/close the open portion of the chamber 110.

The first support 120 may support a display substrate D. In this case, the first support 120 may support the display substrate D in various ways. For example, the first support 120 may include an electrostatic chuck or an adhesive chuck. In another embodiment, the first support 120 may include a bracket, a clamp, etc. supporting a portion of the display substrate D. The first support 120 is not limited thereto and may include all apparatuses that may support the display substrate D. However, hereinafter, for convenience of description, the case where the first support 120 includes an electrostatic chuck or an adhesive chuck is mainly described in detail.

The mask assembly 1 may be seated on and supported by the second support 130. In this case, the second support 130 may fine-adjust the mask assembly 1 in at least two different directions.

The vision unit 140 may capture the positions of the display substrate D and the mask assembly 1. In this case, the display substrate D and the mask assembly 1 may be aligned by moving at least one of the display substrate D and the mask assembly 1 based on an image captured by the vision unit 140.

The deposition source 160 may supply a deposition material. The deposition source 160 may be formed in various shapes. For example, the deposition source 160 may include a point-deposition source in which an inlet discharging a deposition material is formed in a circular shape. In addition, the deposition source 160 may include a linear deposition source formed long and in which a plurality of inlets are formed or an inlet is formed in a long cavity shape. Hereinafter, for convenience of description, the case where the deposition source 160 is arranged to face one point of the mask assembly 1 and has a point-deposition source shape is mainly described in detail.

The pressure adjustor 170 may be connected to the chamber 110 to adjust the pressure inside the chamber 110 to be similar to the atmospheric pressure or vacuum. In this case, the pressure adjustor 170 may include a connection pipe 171 and a pressure adjusting pump 172, the connection pipe 171 being connected to the chamber 110, and the pressure adjusting pump 172 being arranged on the connection pipe 171.

A method of manufacturing a display device (not illustrated) through the apparatus 100 configured to manufacture a display device is described. First, the display substrate D may be manufactured and prepared, and the mask assembly 1 may be prepared through the method of manufacturing a mask.

The pressure adjuster 170 may maintain the inside of the chamber 110 in an atmospheric pressure. After the gate value 110A is opened, the display substrate D and the mask assembly 1 may be inserted into the chamber 110. In this case, separate robot arm, shuttle, etc. may be provided to the inside or outside of the chamber 110 to transfer the display substrate D and the mask assembly 1. The mask assembly 1 may be arranged to face the display substrate D. In addition, the mask assembly 1 may be closely attached to the display substrate D.

When the above process is completed, the pressure adjustor 170 may maintain the inside of the chamber 110 to be almost at the level of a vacuum. In addition, the vision unit 140 may capture the display substrate D and the mask assembly 1, fine-drive the first support 120 and the second support 130 to fine-adjust at least one of the display substrate D and the mask assembly 1, and thus align the display substrate D and the mask assembly 1.

The deposition source 160 may supply a deposition material to the mask assembly 1. The deposition material passing through the mask assembly 1 may be deposited on the display substrate D in a predetermined pattern.

While the above process is performed, at least one of the deposition source 160 and the display substrate D may perform a linear motion. In another embodiment, deposition may be performed while both the deposition source 160 and the display substrate D are stationary. Hereinafter, for convenience of description, the case where deposition is performed when the deposition source 160 performs a linear motion while the display substrate D is stationary is mainly described in detail.

Therefore, because the apparatus 100 configured to manufacture a display device may perform deposition with the transformation of the mask sheet 11 minimized, a deposition material may be deposited precisely and accurately.

Figure 9A:
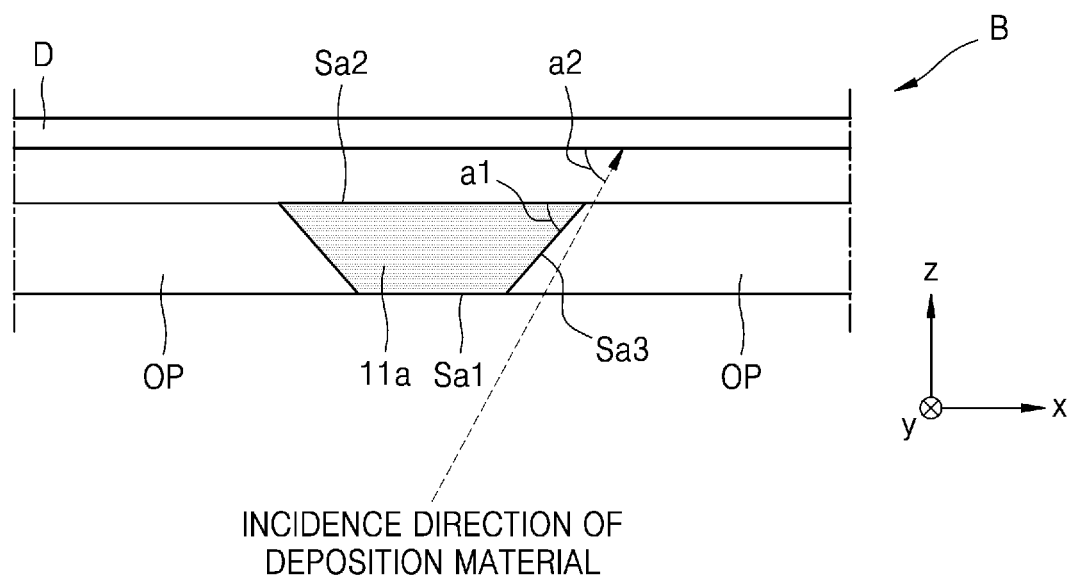
FIG. 9A is a cross-sectional view illustrating a portion of a process of manufacturing a display device using an apparatus configured to manufacture a display device according to an embodiment.

FIG. 9A is a cross-sectional view illustrating a portion of a process of manufacturing a display device through an apparatus configured to manufacture a display device according to an embodiment.

Deposition material supplied from the deposition source 160 may be directed incident toward the display substrate D at predetermined angles with respect to the display substrate D. One or more angles formed by directions in which the deposition material is incident and a deposition surface of the display substrate D may include 90° or an angle less than 90°.

The deposition material may pass through the openings OP of the mask 10 and be deposited on the display substrate D. The deposition material cannot be deposited in a region that is covered by the mask 10 among regions of the display substrate D.

According to an embodiment, for a given output of deposition material, a first angle a1 of the first portion 11a of a portion of the mask 10 may be less than a second angle a2 formed by a direction in which the deposition material is incident with the deposition surface of the display substrate D. In an embodiment, the second angle a2 may include an angle at which the deposition material is incident upon the display substrate D through an opening OP of the mask 10 that is farthest away from the deposition source 160 in plan view. In another embodiment, the second angle a2 may include a predetermined angle calculated or simulated such that the deposition material passing through an opening OP is uniformly deposited on the display substrate D. Through this, the display device in which a shadow phenomenon is minimized, uniform deposition may be performed, and a dead space is minimized may be obtained. A shadow phenomenon may typically occur when the deposition material incident at the second angle a2 does not reach the display substrate D due to the first portion 11a of the mask 10.

In the case where the first portion 11a of the mask 10 has a cross-sectional shape in which a most protruding portion from the lateral surface Sa3 toward the opening OP is located between the first surface Sa1 and the second surface Sa2, the deposition material that is incident does not reach the display substrate D due to the protruding portion of the first portion 11a, and thus the shadow phenomenon may occur. In contrast, according to an embodiment, a cross-sectional shape may be provided in which a most protruding portion from the lateral third surface Sa3 of the first portion 11a of the mask 10 toward the opening OP is arranged on the same plane as the second surface Sa2 of the first portion 11a. That is, the most protruding portion from the lateral surface Sa3 may be arranged closest to the display substrate D. Through this, the display device may be obtained in which the shadow phenomenon is minimized, uniform deposition may be performed and a dead space may be minimized. The shadow phenomenon being a phenomenon hiding the deposition material that is incident.

Figure 9B:
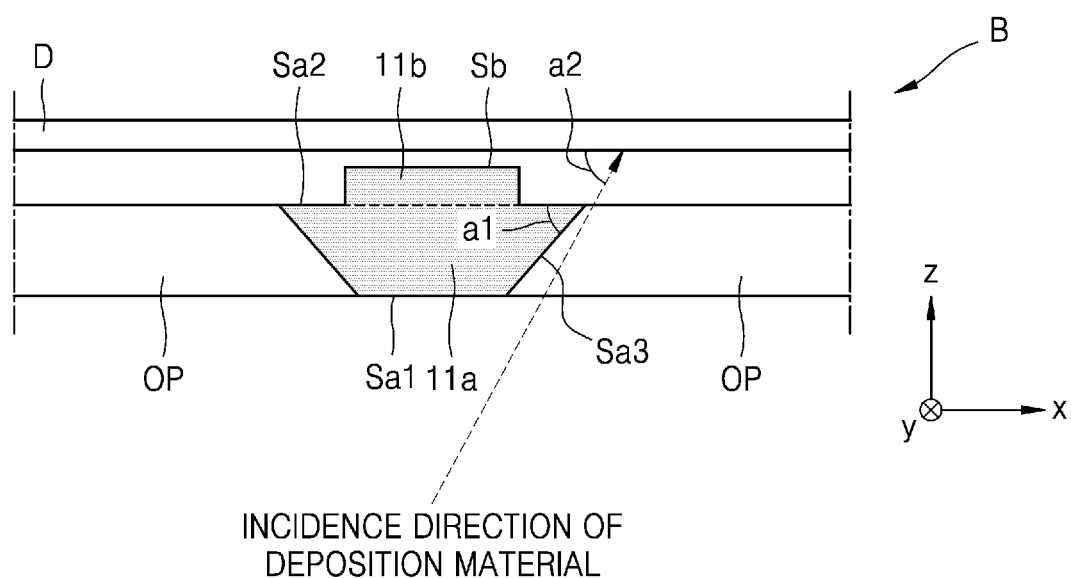
FIG. 9B is a cross-sectional view illustrating a portion of a process of manufacturing a display device using an apparatus configured to manufacture a display device according to another embodiment.

FIG. 9B is a cross-sectional view illustrating a portion of a process of manufacturing a display device through an apparatus configured to manufacture a display device according to another embodiment. The same contents as those described with reference to FIG. 9A are omitted and differences are mainly described below.

Referring to FIG. 9B, the mask 10 may include the second portion 11b protruding in the opposite direction of the mask frame 20 from the first portion 11a. The second portion 11b may be between the first portion 11a and the display substrate D. That is, the second portion 11b may be arranged closer to the display substrate D than the second surface Sa2 of the first portion 11a.

Though the mask assembly 1 is closely attached to the display substrate D, there may be a minimum separation space between the mask assembly 1 and the display substrate D. According to an embodiment, the second portion 11b of the mask 10 may be arranged in the separation space to minimize the deposition material reaching a region of the display substrate D where deposition is not desired. The region where deposition is not desired may include a surrounding area SA in which a driver, etc. of a display device 30 are arranged as described below with reference to FIG. 10. That is, the region in which the second portion 11b of the mask 10 is arranged may correspond to the surrounding area SA of the display device 30 manufactured by using the mask 10. A width of the second portion 11b may be adjusted depending on a width of the surrounding area SA and the number of openings OP of the mask 10.

Figure 10:
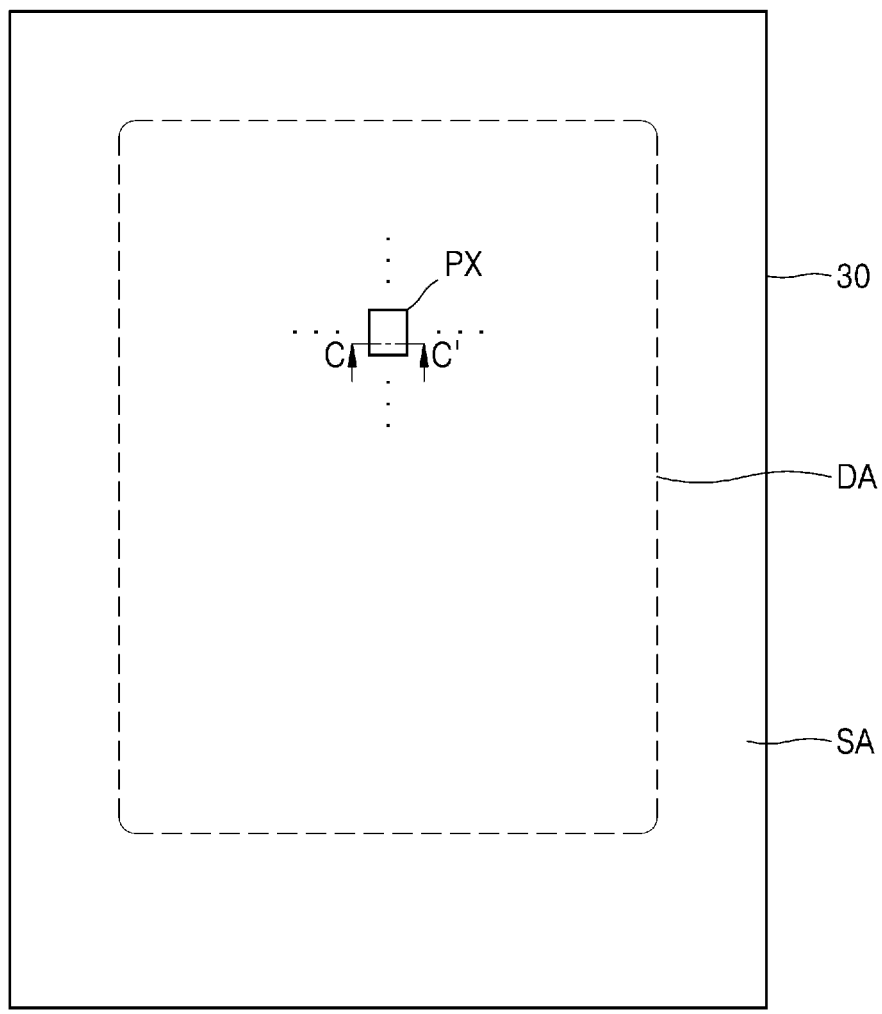
FIG. 10 is a plan view illustrating a display device manufactured by using an apparatus configured to manufacture a display device according to an embodiment.

FIG. 10 is a plan view of the display device 30 manufactured by using an apparatus configured to manufacture a display device according to an embodiment.

Referring to FIG. 10, the display device 30 may include the display area DA and the surrounding area SA outside the display area DA. The display device 30 may display an image through an array of pixels PX two-dimensionally arranged in the display area DA. The surrounding area SA includes a region that does not display an image and may entirely or partially surround the display area DA. A driver, etc. configured to provide an electric signal or power to the pixels PX may be arranged in the surrounding area SA. A pad may be arranged in the surrounding area SA, the pad being a region to which an electronic element or a printed circuit board, etc. may be electrically connected.

Figure 11:
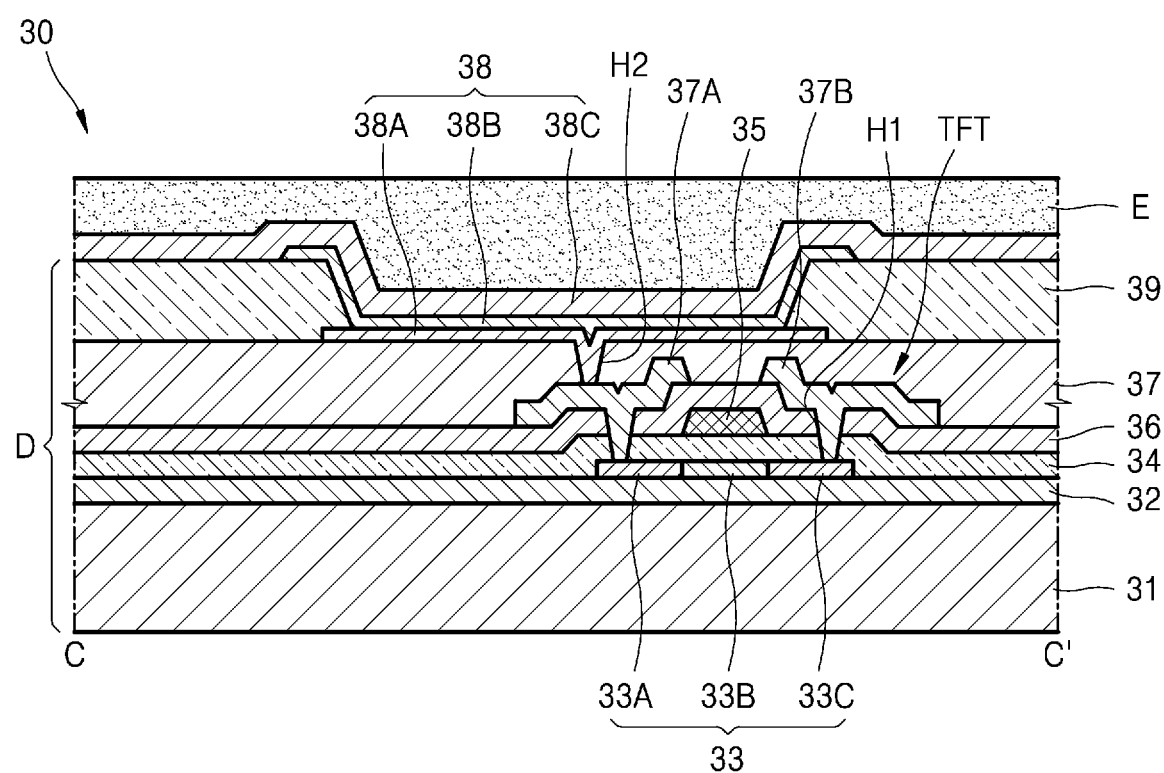
FIG. 11 is a cross-sectional view of a portion of the display device of FIG. 10.

FIG. 11 is a cross-sectional view of a portion of the display device 30 of FIG. 10. FIG. 11 is a cross-sectional view of the display device 30 taken along line B-B' illustrated in FIG. 10.

Referring to FIG. 11, the display device 30 may include the display substrate D, an intermediate layer 38B, an opposite electrode 38C, and an encapsulation layer (not illustrated). In this case, the display substrate D may include a substrate 31, a buffer layer 32, a thin film transistor TFT, a planarization layer 37, a pixel electrode 38A, and a pixel-defining layer 39. In addition, the encapsulation layer may include an encapsulation substrate (not illustrated) or a thin-film encapsulation layer E which is the same as or similar to the substrate 31. In the case where the encapsulation layer includes the encapsulation substrate, a separate sealing member (not illustrated) may be arranged between the substrate 31 and the encapsulation substrate. However, for convenience of description, the case where the encapsulation layer includes the thin-film encapsulation layer E is mainly described below in detail.

The substrate 31 may have a multi-layered structure including a base layer and an inorganic layer, the base layer including a polymer resin. For example, the substrate 31 may include a base layer and a barrier layer, the base layer including a polymer resin, and the barrier layer including an inorganic insulating layer.

The buffer layer 32 may be arranged on the substrate 31. The buffer layer 32 may reduce or block the penetration of foreign substances, moisture, or external air from below the substrate 31 and provide a flat surface on the substrate 31. The buffer layer 32 may include an inorganic insulating material such as silicon oxide, silicon oxynitride, and silicon nitride and include a single layer or a multi-layer including the above materials.

An active layer 33 arranged in a predetermined pattern may be formed on the buffer layer 32 and then covered by a gate insulating layer 34. The active layer 33 may include a source region 33C and a drain region 33A and further include a channel region 33B therebetween.

The active layer 33 may include various materials. For example, the active layer 33 may include an inorganic semiconductor material such as amorphous silicon or crystalline silicon. For another example, the active layer 33 may include an oxide semiconductor. For another example, the active layer 33 may include an organic semiconductor material. However, hereinafter, for convenience of description, the case where the active layer 33 includes amorphous silicon is mainly described in detail.

The active layer 33 may be formed by forming an amorphous silicon layer on the buffer layer 32, crystallizing the amorphous silicon layer into a polycrystalline silicon layer, and patterning the polycrystalline silicon layer. In the active layer 33, the source region 33C and the drain region 33A may be doped with impurities depending on the kind of the thin film transistor such as a driving thin film transistor and a switching thin film transistor.

A gate electrode 35 and an interlayer insulating layer 36 may be formed on a top surface of the gate insulating layer 34, the gate electrode 35 corresponding to the active layer 33, and the interlayer insulating layer 36 covering the gate electrode 35.

Contact holes H1 are formed in the interlayer insulating layer 36 and the gate insulating layer 34, and then a source electrode 37B and a drain electrode 37A may be formed on the interlayer insulating layer 36 such that the source electrode 37B and the drain electrode 37A respectively contact the source region 33C and the drain region 33A.

The planarization layer 37 may be formed on the thin film transistor formed as described above and a pixel electrode 38A of an organic light-emitting diode 38 may be formed on the planarization layer 37. The pixel electrode 38A may contact the drain electrode 37A of the thin film transistor TFT through a via hole H2 formed in the planarization layer 37. The planarization layer 37 may include an inorganic material and/or an organic material, include a single layer or two or more layers. The planarization layer 37 may include a planarization layer such that a top surface thereof is flat regardless of bending of a layer thereunder. In contrast, the planarization layer 37 may be formed to be bent along the bending of a layer thereunder. In addition, it is preferable that the planarization layer 37 includes a transparent insulating material to accomplish a resonance effect.

After the pixel electrode 38A is formed on the planarization layer 37, the pixel-defining layer 39 is formed to cover at least a portion of the pixel electrode 38A and the planarization layer 37. The pixel-defining layer 39 may include an opening to expose the pixel electrode 38A. In addition the intermediate layer 38B and the opposite electrode 38C may be formed on the pixel electrode 38A.

The pixel electrode 38A may serve as an anode and the opposite electrode 38C may serve as a cathode. The polarity of the pixel electrode 38A and the opposite electrode 38C may be reversed.

The pixel electrode 38A may be insulated from the opposite electrode 38C by the intermediate layer 38B. An organic emission layer may emit light by applying voltages of different polarities to the intermediate layer 38B.

The intermediate layer 38B may include the organic emission layer. In another embodiment, the intermediate layer 38B may include the organic emission layer and further include at least one of a hole injection layer (HIL), a hole transport layer (HTL), an electron transport layer (ETL), and an electron injection layer (EIL). The present embodiment is not limited thereto and the intermediate layer 38B may include the organic emission layer and further include various functional layers (not illustrated).

The thin-film encapsulation layer E may include a plurality of inorganic layers or include an inorganic layer and an organic layer.

The organic layer of the thin-film encapsulation layer E may include a polymer-based material. The polymer-based material may include an acryl-based resin, an epoxy-based resin, polyimide, and polyethylene. For example, the organic layer may include an acrylic resin, for example, polymethylmethacrylate, poly acrylic acid, etc. The organic layer may be formed by hardening a monomer or coating a polymer.

The inorganic layer of the thin-film encapsulation layer E may include an inorganic insulating material. The inorganic insulating material may include aluminum oxide, titanium oxide, tantalum oxide, hafnium oxide, zinc oxide, silicon oxide, silicon nitride, and/or silicon oxynitride.

An uppermost layer of the thin-film encapsulation layer E that is exposed to the outside may include an inorganic material to prevent moisture from penetrating into the organic light-emitting diode.

The thin-film encapsulation layer E may include at least one sandwich structure in which at least one organic layer is inserted between at least two inorganic layers. For another example, the thin-film encapsulation layer E may include at least one sandwich structure in which at least one inorganic layer is inserted between at least two organic layers. For another example, the thin-film encapsulation layer E may include a sandwich structure in which at least one organic layer is inserted between at least two inorganic layers and a sandwich structure in which at least one inorganic layer is inserted between at least two organic layers.

The thin-film encapsulation layer E may include a first inorganic layer, a first organic layer, and a second inorganic layer sequentially from the upper portion of the organic light-emitting diode 38. For another example, the thin-film encapsulation layer E may include a first inorganic layer, a first organic layer, a second inorganic layer, a second organic layer, and a third inorganic layer sequentially from the upper portion of the organic light-emitting diode 38.

A metal layer, an organic layer, or an inorganic layer may be formed at an accurate position by using the apparatus 100 configured to manufacture the display device according to an embodiment, the metal layer, the organic layer, or the inorganic layer being on the entire surface of the display area DA of the display device 30. For example, the opposite electrode 38C and the thin-film encapsulation layer E may be formed at accurate positions. Through this, the display device 30 of a uniform quality may be manufactured.

According to an embodiment described above, a mask having a high precision may be obtained and deposition precision and deposition uniformity may be improved by using the mask of a high precision. In addition, a mask in which a shadow effect is reduced may be obtained, and by using this, uniform deposition may be performed and a display device in which a dead space is minimized may be obtained. However, the scope of the inventive concepts are not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display device, the method comprising:
   preparing a mask assembly;
   arranging the mask assembly to face a substrate, the substrate extending in a first direction;
   attaching the mask assembly to the substrate; and
   supplying, by a deposition source, a deposition material to pass through the mask assembly to deposit the deposition material on the substrate,
   wherein the mask assembly includes:
   a mask frame; and
   a mask sheet including a plurality of openings and having edges bonded to the mask frame,
   a first portion of the mask sheet located between two adjacent openings includes a first surface, a second surface, and a lateral surface, the first surface facing the mask frame, the second surface being opposite to the first surface, and the lateral surface connecting the first surface to the second surface,
   wherein the mask sheet further includes: a second portion protruding in a second direction from the first portion, wherein the second direction is perpendicular to the first direction and is opposite direction of the direction toward the mask frame from the first portion; and
   a first angle between the lateral surface and the second surface is less than a second angle at which the deposition material is incident with respect to the substrate,
   wherein a surface of the second portion is closer to the substrate than the second surface of the first portion, and
   wherein a width of the surface of the second portion is less than a width of the second surface of the first portion.

2. The method of claim 1, wherein the preparing of the mask assembly includes:
   tensioning the mask sheet;
   bonding the mask sheet that is tensioned to the mask frame; and
   forming an opening in the mask sheet by irradiating laser light on the mask sheet.

3. The method of claim 2, wherein the forming of the opening includes:
   forming a first opening by irradiating the laser light at a first position on the mask sheet; and
   forming a second opening by irradiating the laser light at a second position, the second position being apart from the first position by a first distance in a first direction and being apart from the first position by a second distance in a second direction intersecting the first direction,
   wherein the first distance and the second distance include distances corrected from information about a desired position of the second opening based on an offset correction value.

4. The method of claim 2, wherein the forming of the opening includes:

forming a first group of openings in an outside area along an edge of the mask sheet; and sequentially forming a second group of openings inside the first group of openings.

5. The method of claim 2, wherein the forming of the opening includes:

forming a first opening; and forming a second opening symmetrical with the first opening with respect a reference point at a center of the mask sheet.

6. The method of claim 2, wherein the second angle includes an angle at which the deposition material is incident with respect to the substrate through the opening of the mask sheet that is farthest away from the deposition source in a plan view.

7. The method of claim 2, wherein the deposition material deposited on the substrate forms an electrode or a thin-film encapsulation layer of the display device including an organic light-emitting diode.

* * * * *